United States Patent
Malcolm et al.

(10) Patent No.: US 11,605,931 B2
(45) Date of Patent: Mar. 14, 2023

(54) LASER DIODE DRIVE SYSTEM

(71) Applicant: M SQUARED LASERS LIMITED, Glasgow (GB)

(72) Inventors: Graeme Peter Alexander Malcolm, Glasgow (GB); Gareth Thomas Maker, Glasgow (GB); William Miller, Glasgow (GB)

(73) Assignee: M SQUARED LASERS LIMITED, Glasgow (GB)

(*) Notice: Subject to any disclaimer, the term of this patent is extended or adjusted under 35 U.S.C. 154(b) by 52 days.

(21) Appl. No.: 17/045,281

(22) PCT Filed: Apr. 4, 2019

(86) PCT No.: PCT/GB2019/050967
§ 371 (c)(1),
(2) Date: Oct. 5, 2020

(87) PCT Pub. No.: WO2019/193338
PCT Pub. Date: Oct. 11, 2019

(65) Prior Publication Data
US 2021/0175684 A1    Jun. 10, 2021

(30) Foreign Application Priority Data
Apr. 5, 2018 (GB) .................................... 1805609

(51) Int. Cl.
*H01S 5/068* (2006.01)
*H01S 5/026* (2006.01)

(52) U.S. Cl.
CPC ........ *H01S 5/06817* (2013.01); *H01S 5/0261* (2013.01); *H01S 5/0262* (2013.01)

(58) Field of Classification Search
None
See application file for complete search history.

(56) References Cited

U.S. PATENT DOCUMENTS 4,009,385 A    2/1977 Sell
4,307,469 A *  12/1981 Casper ............... H04B 10/0795
                                        398/195

(Continued)

FOREIGN PATENT DOCUMENTS

JP    2012/089564 A    5/2012
WO    WO2014/134340 A1  9/2014

OTHER PUBLICATIONS

International Search Report from PCT/GB2019/050967 dated Aug. 7, 2019.

*Primary Examiner* — Tuan N Nguyen
(74) *Attorney, Agent, or Firm* — FisherBroyles, LLP

(57) ABSTRACT

A laser diode drive system for generating a drive current for a laser diode is described. The laser diode drive system comprises a first laser diode driver connected to the laser diode by a first cable to provide a drive current source for the laser diode. A second laser diode driver is then connected to the laser diode by a second cable to provide a low current sink for the laser diode. A feedback control loop is employed to provide a feedback signal for the second laser diode driver from to sample of an output field of the laser diode. The laser diode drive system exhibits low power consumption while being capable of creating sufficient feedback bandwidth to reduce the excess optical noise by at least an order of magnitude at 1 MHz compared with laser diode drive systems comprising just a first laser diode driver.

15 Claims, 3 Drawing Sheets

(56) References Cited

U.S. PATENT DOCUMENTS

| | | | |
|---|---|---|---|
| 5,182,756 A | | 1/1993 | Waki et al. |
| 5,253,267 A | * | 10/1993 | Johnson ................ H01S 5/0683 |
| | | | 372/38.01 |
| 7,054,344 B1 | | 5/2006 | Nguyen |
| 2005/0213622 A1 | | 9/2005 | Diaz |
| 2006/0291512 A1 | | 12/2006 | Borschowa |
| 2015/0372451 A1 | * | 12/2015 | Fulkerson ........... H01S 5/02469 |
| | | | 372/38.02 |
| 2017/0271844 A1 | | 9/2017 | Bajwa et al. |

\* cited by examiner

LASER DIODE DRIVE SYSTEM

This application is the U.S. National Stage of International Application No. PCT/GB2019/050967, which was filed on Apr. 4, 2019. This application also claims the benefit of the filing date of GB patent application No. 1805609.3, which was filed on Apr. 5, 2018. The contents of both applications are hereby incorporated by reference.

The present invention relates to the field of laser diodes. In particular, an improved laser diode drive system is described which is suitable for reducing noise within the output field of a high power laser diode.

A laser diode system 1 known in the art is presented schematically in FIG. 1. The laser diode system 1 can be seen to comprise a high-power laser diode 2 connected to a remotely located laser diode driver 3 by a cable 4, the cable 4 typically having a length of several meters. In order to generate a high-power output field 5 (typically in the range of tens to hundreds of watts) from the laser diode 2 the laser diode driver 3 is employed as a low noise constant current source, providing an electrical drive current in the region of tens to 100 Amps to the laser diode 2. To be able to transmit these high current levels the cable 4 is required to by a heavy-gauge cable i.e. a cable having a cross sectional area greater than 5 mm$^2$ and typically of the order of 10 mm$^2$.

High power laser diodes 2 are known to generate optical noise well above the quantum level or the noise levels associated with the electrical drive current generated by the laser diode driver 3. To reduce the noise levels within the output field 5, the laser diode system 1 is known to incorporate a feedback control loop 6 wherein a fraction of the output field 5, before or after parametric frequency conversion, is sampled with a photodiode 7. An electrical output from the photodiode 7 is then employed to generate an error signal and then a corrective feedback signal for the laser diode driver 3. This feedback signal acts to modify the electrical drive current generated by the laser diode driver 3 in order to reduce the optical noise present within the output field 5.

The response time, gain and bandwidth of the feedback control loop 6 determines the level by which the optical noise within the output field 5 can be reduced at any particular operating frequency of the laser diode 2. High power laser diodes 2 typically generate excess noise up to a few MHz, reducing beyond this to the quantum limit. To be effective, the feedback control loop 6 must therefore have a useful bandwidth of several MHz.

The semiconductor gain medium within the laser diode 2 is designed such that it can reliably handle the abovementioned current and power levels, however these designs tend to limit their useable bandwidth.

The applicants have also found that a number of factors act to limit the bandwidth of the high current source provided by the laser diode driver 3 and thus the ability of the feedback control loop 6 to reduce the noise levels present on the output field 5 generated by the prior art laser diode system 1 of FIG. 1.

An ideal current source for the laser diode 2 is required to exhibit an infinite output impedance at all frequencies and instantaneously generate whatever voltage is necessary to establish the requested current across the laser diode 2. However, since the laser diode driver 3 is being employed as a high current source (~50 Amps) it has a predominantly capacitive output impedance which limits the rate at which the output "compliance" voltage can change in response to a change in the required current, thus becoming an increasingly less accurate current source for higher frequency disturbances.

The heavy-gauge cable 4 connecting the laser diode driver 3 to the high-power laser diode 2 is found to exhibit a predominantly inductive characteristic. Combined with the low impedance levels exhibited by the high-power laser diode 2 this effectively forms a low pass frequency filter which is significant over the noise frequency spectrum of the high-power laser diode 2.

The capacitance of the laser diode driver 3 and the heavy-gauge cable 4 inductance also tend to form a resonant circuit, further complicating the spectrum of the current noise and the operation of the feedback control loop 6. The high output capacitance of the laser diode driver 3 and the high inductance of the heavy-gauge cable 4 therefore combine to significantly restrict the bandwidth within which the laser diode current can respond to a change of the high current provided by the laser diode driver 3.

The above factors therefore combine to limit the bandwidth of a noise cancelling system that employs a feedback control loop 6 to modifying the drive current generated by the laser diode driver 3, thus limiting the optical noise reductions that can be achieved within the output field 5.

SUMMARY OF INVENTION

It is an object of an embodiment of the present invention to obviate or at least mitigate the foregoing disadvantages of the methods and apparatus for reducing noise within the output field of a laser diode.

A further object of the present invention is to provide a laser diode drive system for a high power laser diode that is able to reduce the noise levels within the output field of the high power laser diode when compared with those laser diode drivers known in the art.

According to a first aspect of the present invention there is provided a laser diode drive system suitable for providing a drive current for a laser diode, the laser diode drive system comprising:

a first laser diode driver connected to the laser diode by a first cable to provide a drive current source to the laser diode;

a second laser diode driver connected to the laser diode by a second cable to provide a low current sink for the drive current source to the laser diode; and a feedback control loop arranged to sample a fraction of an output field of the laser diode and provide a feedback signal for the second laser diode driver.

The above described laser diode drive system provides a noise reduction technique that consumes very little power but is capable of creating enough feedback control loop bandwidth to reduce the excess optical noise by at least an order of magnitude at 1 MHz.

Most preferably the second laser diode driver is connected in electrical parallel with the laser diode.

Most preferably the length of the second cable is much shorter than the length of the first cable. The first cable may comprise a heavy-gauge cable.

The feedback control loop preferably comprises a photodiode arranged to convert the sample of a fraction of the output field into an electrical error signal. The feedback control loop preferably further comprises a loop bandwidth controller employed to convert the electrical error signal into the feedback signal. Preferably the feedback control loop further comprise an amplifier located between the photodiode and the loop bandwidth controller.

Most preferably the second laser diode driver is arranged to sink between 0.1% and 20% of the drive current generated by the first laser diode driver. Optionally, the second laser diode driver is arranged to sink between 0.1% and 5% of the drive current generated by the first laser diode driver.

According to a second aspect of the present invention there is a method of providing a drive current to a laser diode, the method comprising:

connecting a first laser diode driver to the laser diode by a first cable to provide a drive current source to the laser diode;

connecting a second laser diode driver to the laser diode by a second cable to provide a low current sink for the drive current source to the laser diode; and generating a feedback signal for the second laser diode driver from a fraction of an output field of the laser diode.

Most preferably the second laser diode driver is connected in electrical parallel with the laser diode.

Generating the feedback signal may comprise employing a photodiode to convert the sample of a fraction of the output field into an electrical error signal. Generating the feedback signal may further comprise employing a loop bandwidth controller to convert the electrical error signal into the feedback signal. Optionally generating the feedback signal comprises amplifying the electrical error signal.

Most preferably the second laser diode driver is arranged to sink between 0.1% and 20% of the drive current generated by the first laser diode driver. Optionally, the second laser diode driver is arranged to sink between 0.1% and 5% of the drive current generated by the first laser diode driver.

Embodiments of the second aspect of the invention may comprise features to implement the preferred or optional features of the first aspect of the invention or vice versa.

BRIEF DESCRIPTION OF DRAWINGS

There will now be described, by way of example only, various embodiments of the invention with reference to the drawings, of which.

Figure 1:
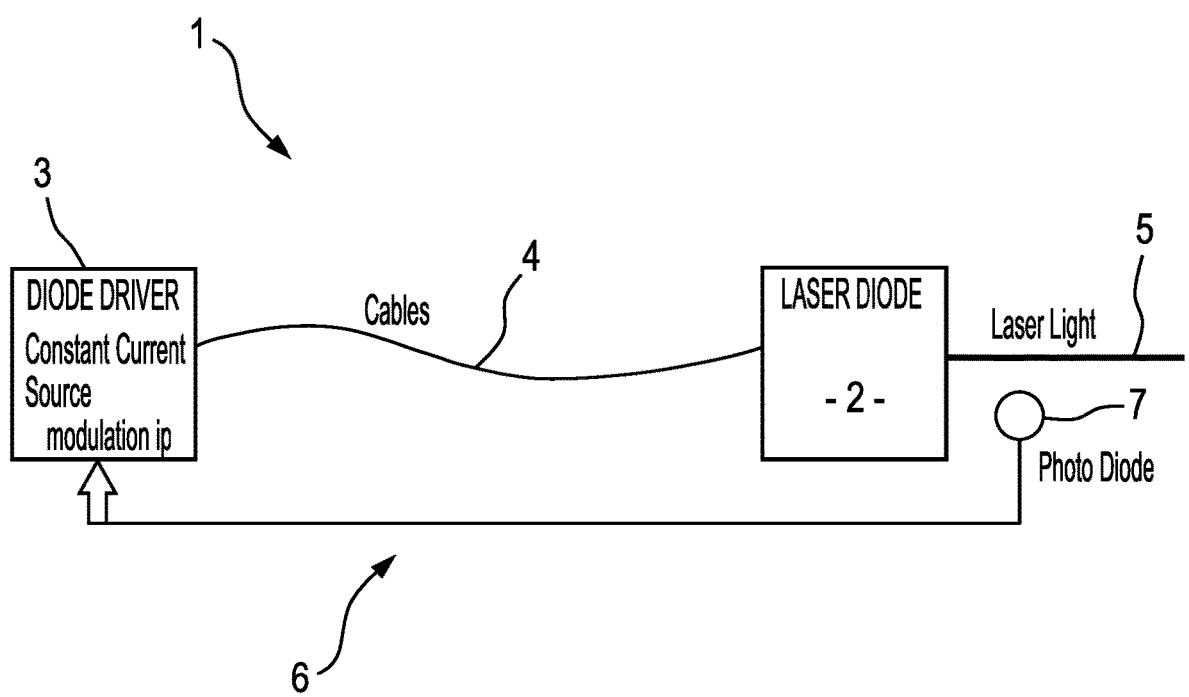
FIG. 1 presents a schematic representation of a laser diode system as known in the art.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION

Figure 2:
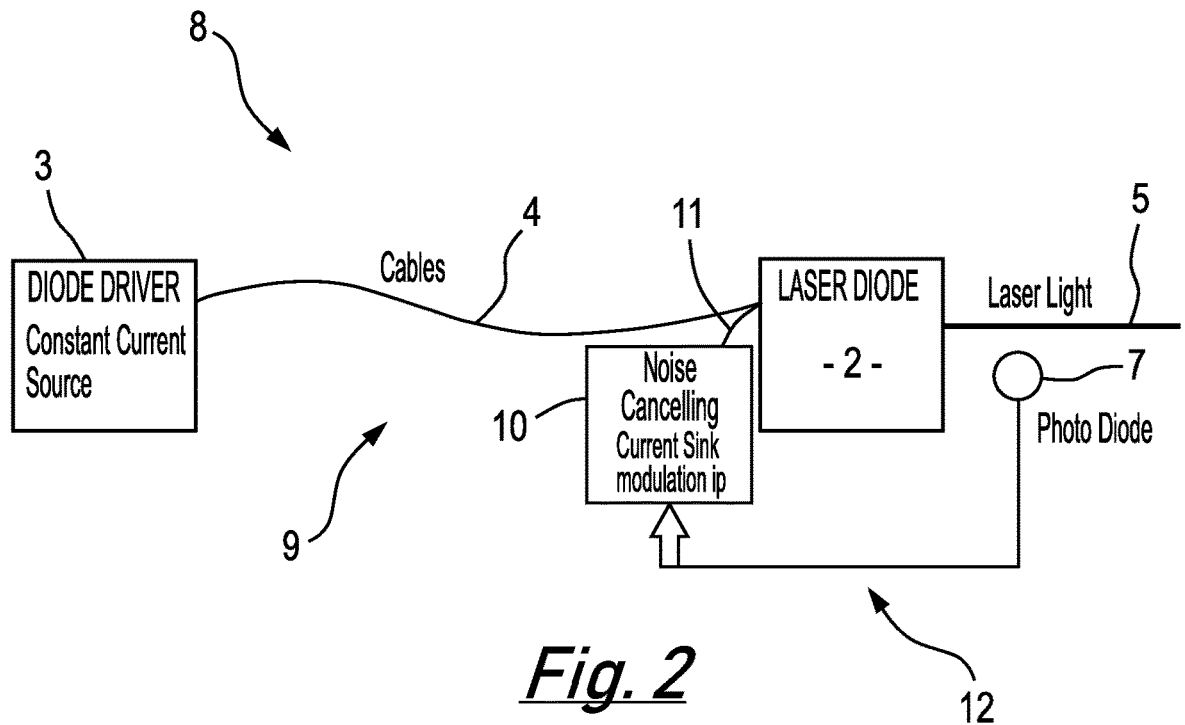
FIG. 2 presents a schematic representation of a laser diode system that incorporates a laser diode drive system in accordance with an embodiment of the present invention.

Referring initially to FIG. 2, a schematic representation of a laser diode system 8 that incorporates a laser diode drive system 9 in accordance with an embodiment of the present invention is shown. The laser diode system 8 can again be seen to comprise a high-power laser diode 2. In the presently described embodiment, the laser diode drive system 9 comprises a first laser diode driver 3 that is connected to the high-power laser diode 2 by a heavy-gauge cable 4 in a similar manner to that described above in connection with the laser diode system 1 of FIG. 1. However, in the presently described embodiment, laser diode drive system 9 further comprises a second laser diode driver 10 connected in electrical parallel with the laser diode 2 to provide a low current sink for the drive current source to the laser diode 2. For reasons that will become apparent from the following discussion, it is preferable for the electrical cables 11 that connect second laser diode driver 10 in parallel with the laser diode 2 to be much shorter than the heavy-gauge cable 4 such that the second laser diode driver 10 can be located physically closer to the laser diode 2 than the first laser diode driver 3.

Figure 3:
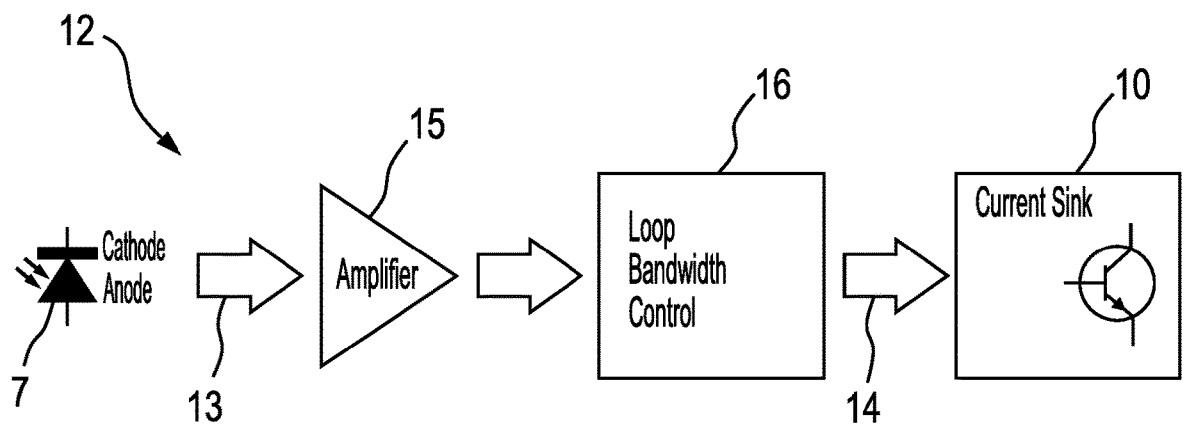
FIG. 3 present a schematic representation of a feedback control loop of the laser diode drive system of FIG. 2.

Another difference between the laser diode system 8 of FIG. 2 and that presented in FIG. 1 is in the form of a feedback control loop 12, a schematic representation of which is presented in FIG. 3. The feedback control loop 12 again employs a photodiode 7 to sample a fraction of the output field 5 of the high-power laser diode 2. An electrical output from the photodiode 7 is then employed as an error signal 13 which is converted into a feedback signal 14 for the second laser diode driver 10 by an amplifier 15 and a loop bandwidth controller 16. The feedback signal 14 thus provides a means for modifying the low current sink generated by the second laser diode driver 10.

When both the laser diode drivers 3 and 10 of the laser diode system 8 are in operation the low current generated by the second laser diode driver 10 is effectively subtracted from the electrical drive current generated by the first laser diode driver 3. In practice, the amount of current through the second laser diode driver 10 must set to be slightly higher than the peak to peak current which is required to cancel the optical noise within the output field 5. This excess optical noise, although well above the quantum limit is typically of the order of 0.1% over the significant operating bandwidth. The second laser diode driver 10 therefore needs only to sink somewhat more than 0.1% of electrical drive current generated by the first laser diode driver 3, leaving enough margin for the second laser diode driver 10 to operate linearly. In practice, the second laser diode driver may be arranged to sink between 0.1% and 20% of the drive current generated by the first laser diode driver. Optionally, the second laser diode driver is arranged to sink 0.1% and 5% of the drive current generated by the first laser diode driver.

For example, when the laser diode 2 is driven with a 50 Amp electrical drive current generated by the first laser diode driver 3, the second laser diode driver 10 only needs to sink around 100 mAmps. It will be appreciated by the skilled person that this current 'robbing' affects only the current into the laser diode 2 and the first laser diode driver 3 supplying the electrical drive current remains unaffected, other than requiring its output level to be increased slightly to maintain the original drive current into the laser diode 2.

The feedback signal 14 is applied to the control input of the second laser diode driver 10 with the appropriate polarity such that an instantaneous increase in light level detected by the photodiode 7 results in an instantaneous increase in current through the second laser diode driver 10, thus reducing the laser diode drive current and hence the power of the output field 5. Significantly, by generating the feedback signal 14 locally to the second laser diode driver 10, it is unaffected by the impedance of the heavy-gauge cable 4 connecting the first laser diode driver 3 to the laser diode 2.

The impedance of the cables 11 is also minimised by keeping them short relative to the length of the heavy-gauge cable 4.

Figure 4:
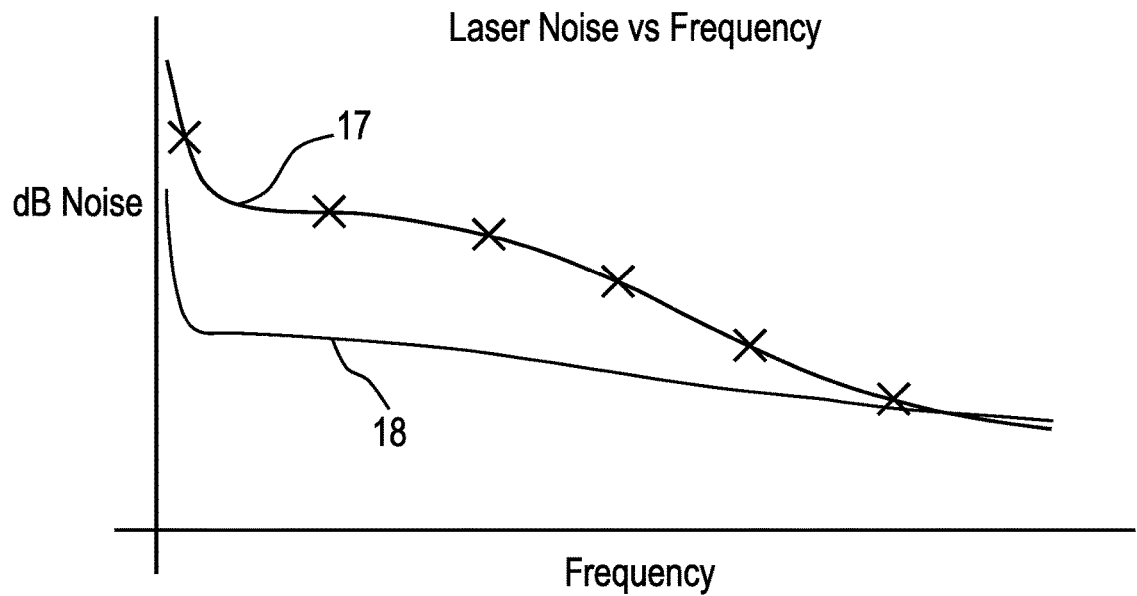
FIG. 4 presents theoretical graphs of noise versus operating frequency for the laser diode systems of FIGS. 1 and 2.
Figure 5:
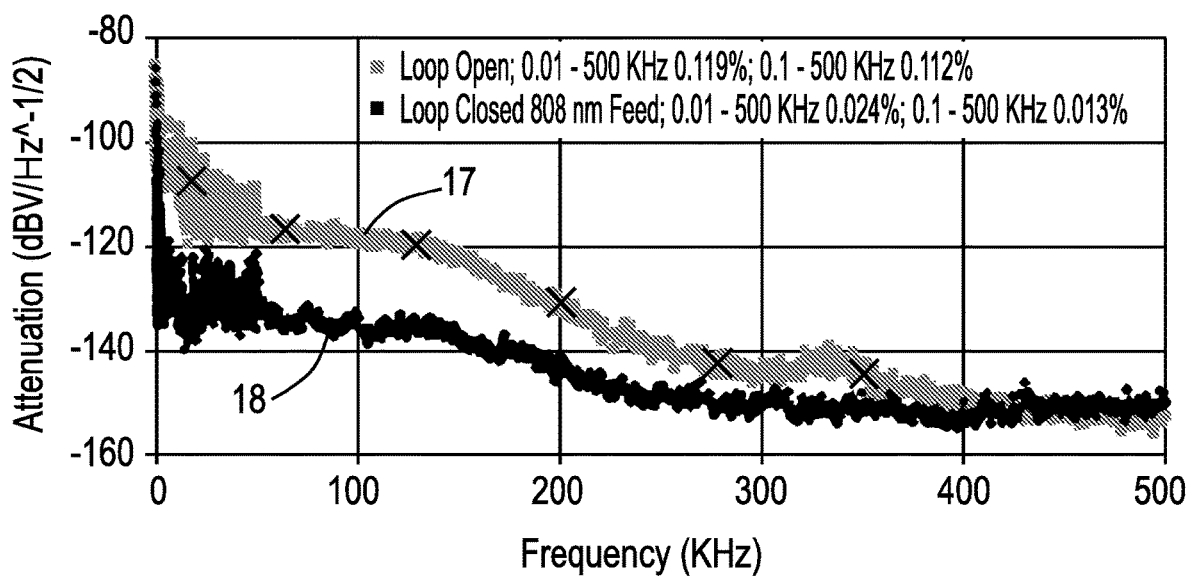
FIG. 5 presents experimental graphs of noise versus operating frequency for the laser diode systems of FIGS. 1 and 2.

Theoretical and experimental noise versus operating frequency results obtained from the above described laser diode systems 1 and 8 are presented within FIGS. 4 and 5, respectively. The high-power laser diode 2 employed in obtaining these results was a conduction cooled, single bar laser diode designed to provide a continuous wave output field 5 having a power of 40 Watts at an operating wavelength of 808 nm. The open loop results (i.e. those obtained in the presence of the first laser diode driver 3 only) are represented by the lines marked with "x" and reference numeral 17, while the closed loop results (i.e. those obtained in the presence of both the first laser diode driver 3 and the second laser diode driver 10) are represented by the unmarked lines and reference numeral 18.

As can be seen from both of these figures the noise levels on the output field 5 generated by the laser diode system 8 of FIG. 2 are significantly reduced when compared with those of the laser diode system 1 of FIG. 1. The reason for these reduced noise levels resides in the fact that the above described bandwidth limitations of the feedback control loop 6 of laser diode system 1 are reduced within the present invention by placing the controllable second laser diode driver 10 in parallel with the laser at the end of the heavy-gauge cable 4. This arrangement effectively adds inductance between the second laser diode driver 10 and the output capacitance of the first laser diode driver 3. The impedance of the heavy-gauge cable 4 increases with frequency, thus it also acts to electrically isolate the controllable second laser diode driver 10 and the high-power laser diode 2 from the output capacitance of the first laser diode driver 3. The overall result is an increase, rather than a decrease, in the bandwidth of the controllable second laser diode driver 10.

The theoretical simulations employed to generate the results of FIG. 4 were based on typical heavy-gauge cable 4 characteristics (i.e. one with a cross sectional area of 10 mm$^2$) and indicate a control bandwidth of tens of MHz being available to the laser diode system 8.

It should be noted that if the controllable second laser diode driver 10 were to be placed directly across the first laser diode driver 3 its bandwidth would be significantly affected by the output capacitance of the first laser diode driver 3, thus again limiting the available control bandwidth for the laser diode system 8.

In practice the above described laser diode drive system 9 provides a noise reduction technique that consumes very little power but is capable of creating enough feedback control loop bandwidth to reduce the excess optical noise by at least an order of magnitude at 1 MHz. It will be appreciated that the laser diode drive system 9 can be easily incorporated to the laser diode system 1 of FIG. 1 with minimal interaction or dependence on the operating characteristics of the high current laser diode driver 3.

It will be further appreciated that the quiescent current through the controllable second laser diode driver 10 can be set to any level, consistent with safe power dissipation. If set to, for example, 10 A with a 50 A diode current drive it can also be used to provide very high bandwidth deep modulation of the laser diode current, independent of the high current source and connecting cable characteristics. A similar result can also be achieved by sending the feedback signal (suitably processed) to both the first laser diode driver 3 and the second laser diode driver 10. In this embodiment, the lower bandwidth element of the feedback signal, containing the deep modulation, is arranged to provide the feedback signal to the first laser diode driver 3 while the high bandwidth element of the feedback signal provide the feedback signal to the second laser diode driver 10. This embodiment does require more interaction between the first laser diode driver 3 and the second laser diode driver 10 however it does provide a more efficient and effective way to modulate the laser diode current, independent of the high current source and connecting cable characteristics.

By locating the feedback control loop 12 and the second laser diode driver 10 close to the laser diode 2 provides for a higher bandwidth than can be achieved by directly modulating the first laser diode driver 3. The present invention also takes advantage of the connecting cable 4 inductance to achieve higher bandwidth, rather than being restricted by the impedance of the cable 4. The laser diode drive system 9 therefore provides high independence from the characteristics of the first laser diode driver 3 and the connecting cable 4, localising the feedback loop to the laser diode 2.

A laser diode drive system for generating a drive current for a laser diode is described. The laser diode drive system comprises a first laser diode driver connected to the laser diode by a first cable to provide a drive current source for the laser diode. A second laser diode driver is then connected to the laser diode by a second cable to provide a low current sink for the laser diode. A feedback control loop is employed to provide a feedback signal for the second laser diode driver from to sample of an output field of the laser diode. The laser diode drive system exhibits low power consumption while being capable of creating sufficient feedback bandwidth to reduce the excess optical noise by at least an order of magnitude at 1 MHz compared with laser diode drive systems comprising just a first laser diode driver.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers.

Furthermore, reference to any prior art in the description should not be taken as an indication that the prior art forms part of the common general knowledge.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A laser diode drive system suitable for providing a drive current for a laser diode to generate a continuous-wave (CW) optical output field from the laser diode, the laser diode drive system comprising:
   a first laser diode driver connected to the laser diode by a first cable to provide a drive current source to the laser diode;
   a second laser diode driver connected in electrical parallel with the laser diode by a second cable to provide a current sink for the drive current source to the laser diode, wherein the current sink has a lower current than the drive current source; and a feedback control loop arranged to sample a fraction of the CW optical output field of the laser diode and provide an electrical feedback signal for the second laser diode driver to reduce noise in the CW optical output field.

2. A laser diode drive system as claimed in claim 1 wherein the length of the first cable is several meters and the length of the second cable is much shorter than the length of the first cable.

3. A laser diode drive system as claimed in claim 1 wherein the first cable comprises a cable having a cross-sectional area greater than 5 $mm^2$.

4. A laser diode drive system as claimed in claim 1 wherein the feedback control loop comprises a photodiode arranged to convert the sample of a fraction of the CW optical output field into an electrical error signal.

5. A laser diode drive system as claimed in claim 4 wherein the feedback control loop further comprises a loop bandwidth controller employed to convert the electrical error signal into the electrical feedback signal.

6. A laser diode drive system as claimed in claim 5 wherein the feedback control loop further comprise an amplifier located between the photodiode and the loop bandwidth controller.

7. A laser diode drive system as claimed in claim 1 wherein the second laser diode driver provides a current sink between 0.1% and 20% of the drive current generated by the first laser diode driver.

8. A laser diode drive system as claimed in claim 1 wherein the second laser diode driver provides a current sink between 0.1% and 5% of the drive current generated by the first laser diode driver.

9. A laser diode drive system as claimed in claim 1 wherein the first cable comprises a cable having a cross-sectional area on the order of 10 $mm^2$.

10. A method of providing a drive current to a laser diode to generate a continuous-wave (CW) optical output field from the laser diode, the method comprising:

connecting a first laser diode driver to the laser diode by a first cable to provide a drive current source to the laser diode;

connecting a second laser diode driver in electrical parallel with the laser diode by a second cable to provide a current sink for the drive current source to the laser diode, wherein the current sink has a lower current than the drive current source; and generating an electrical feedback signal for the second laser diode driver from a fraction of the CW optical output field of the laser diode to reduce noise in the CW optical output field.

11. A method of providing a drive current to a laser diode as claimed in claim 10 wherein generating the electrical feedback signal comprises employing a photodiode to convert the sample of a fraction of the CW optical output field into an electrical error signal.

12. A method of providing a drive current to a laser diode as claimed in claim 11 wherein generating the electrical feedback signal further comprises employing a loop bandwidth controller to convert the electrical error signal into the electrical feedback signal.

13. A method of providing a drive current to a laser diode as claimed in claim 12 wherein generating the electrical feedback signal comprises amplifying the electrical error signal.

14. A method of providing a drive current to a laser diode as claimed in claim 10 wherein the second laser diode driver provides a current sink between 0.1% and 20% of the drive current generated by the first laser diode driver.

15. A method of providing a drive current to a laser diode as claimed in claim 10 wherein the second laser diode driver provides a current sink between 0.1% and 5% of the drive current generated by the first laser diode driver.

* * * * *